United States Patent
Kuo et al.

(10) Patent No.: US 12,217,960 B2
(45) Date of Patent: Feb. 4, 2025

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Min-Sung Kuo, Hsinchu (TW); I-Kai Hung, Hsinchu (TW); Po-Wei Chen, Hsinchu (TW); Chung-Cheng Chen, Toufen (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 436 days.

(21) Appl. No.: 17/462,284

(22) Filed: Aug. 31, 2021

(65) Prior Publication Data
US 2023/0065555 A1   Mar. 2, 2023

(51) Int. Cl.
*H01L 21/02* (2006.01)
*H01L 21/027* (2006.01)
*H01L 21/768* (2006.01)

(52) U.S. Cl.
CPC ...... *H01L 21/0254* (2013.01); *H01L 21/0273* (2013.01); *H01L 21/76831* (2013.01)

(58) Field of Classification Search
None
See application file for complete search history.

(56) References Cited

U.S. PATENT DOCUMENTS

| | | | |
|---|---|---|---|
| 10,134,945 B1 * | 11/2018 | Liu | H01L 21/185 |
| 2004/0192016 A1 * | 9/2004 | Harle | H01L 33/007 |
| | | | 438/584 |
| 2005/0149936 A1 | 7/2005 | Pilkington | |
| 2008/0149936 A1 | 6/2008 | Joblot et al. | |
| 2009/0278161 A1 | 11/2009 | Lee et al. | |
| 2014/0175481 A1 * | 6/2014 | Tischler | H01L 27/14649 |
| | | | 257/98 |
| 2015/0001587 A1 * | 1/2015 | Yang | H01L 21/0243 |
| | | | 257/200 |

FOREIGN PATENT DOCUMENTS

TW    200827499 A    7/2008

\* cited by examiner

*Primary Examiner* — Alexander G Ghyka
(74) *Attorney, Agent, or Firm* — Slater Matsil, LLP

(57) ABSTRACT

Semiconductor devices and methods of manufacture are provided whereby fences are formed over a substrate and III-V materials are grown over the substrate, wherein the fences block growth of the III-V materials. As such, smaller areas of the III-V materials are grown, thereby preventing stresses that occur with the growth of larger sheets.

20 Claims, 8 Drawing Sheets

SEMICONDUCTOR DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
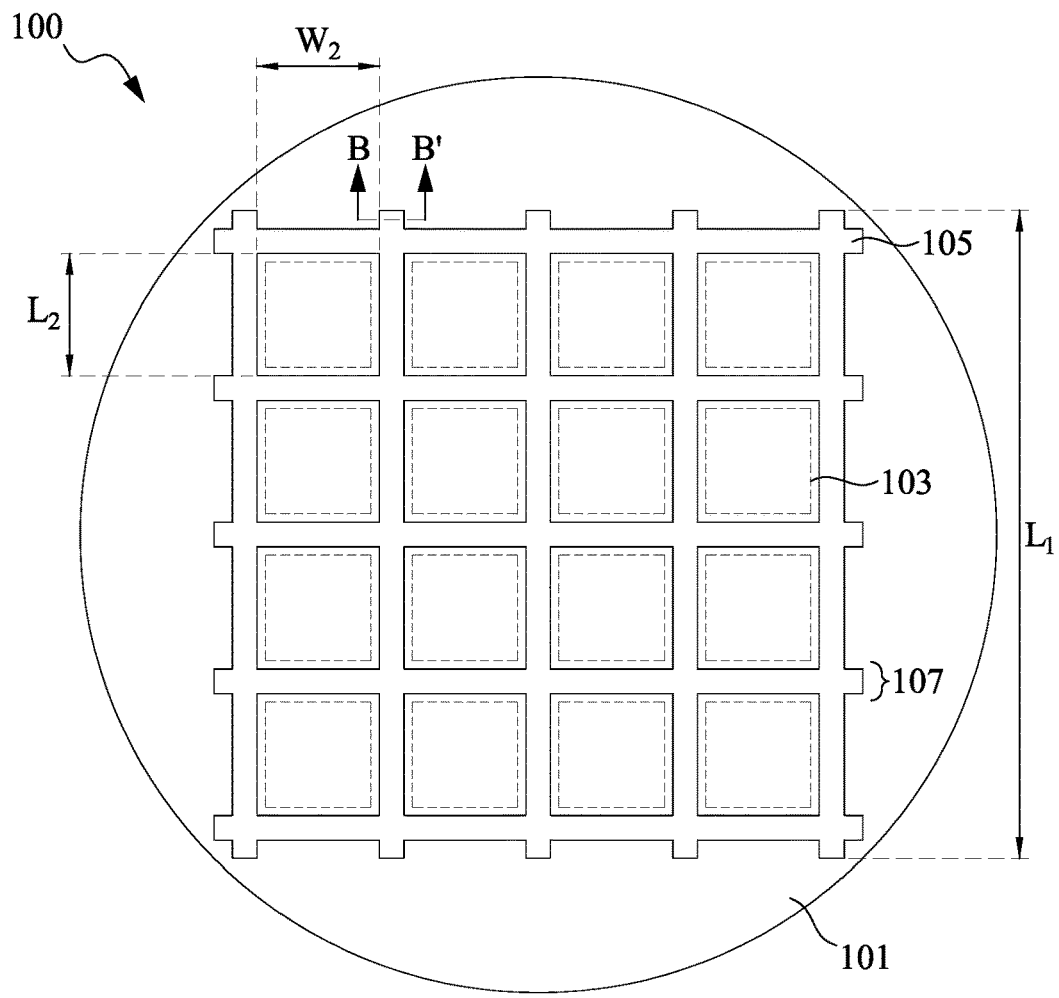
FIGS. 1A-1B illustrate formation of fences on a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures and methods in which fences are utilized to help reduce the stresses that are present within a III-V material grown over a semiconductor wafer. The embodiments described herein, however, may be implemented in a wide variety of structures and methods, and the specific embodiments described herein are not intended to be limited to the precise discussions presented.

Figure 1B:
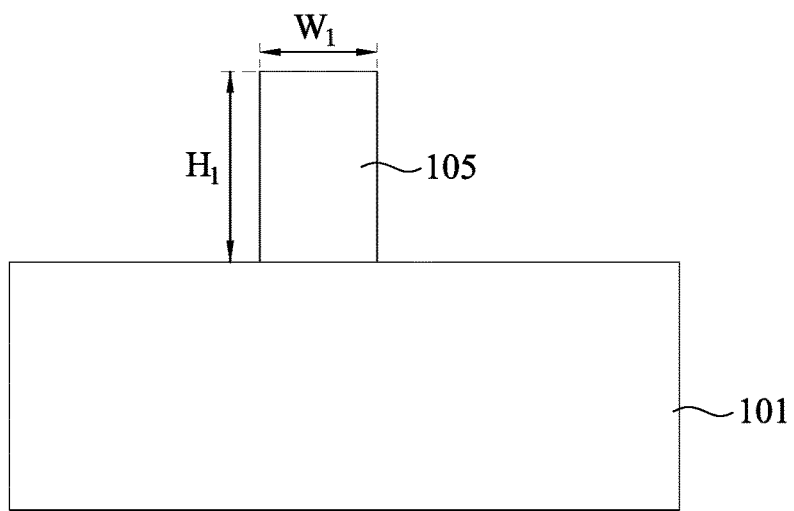

With reference now to FIGS. 1A-1B, there is illustrated a top-down view (FIG. 1A) and a cross-sectional view (FIG. 1B) through line B-B' of a semiconductor wafer 100 with a substrate 101, a plurality of die regions 103, and fences 105 formed on the substrate 101. In an embodiment the substrate 101 comprises a semiconductor material such as silicon or silicon germanium, silicon carbon, sapphire, or may be an insulating or semi-insulating material such as an amorphous silicon oxide or aluminum oxide that has been grown on a support base (not separately illustrated in FIG. 1B), such as a silicon base, for structural support. In another embodiment, the substrate 101 may be a semiconductor on insulator with the insulating material being a single crystal material which may be separately grown and then bonded to the support base using, for example, a fusion bonding process. Any suitable material and suitable method of formation may be utilized.

In a particular embodiment the substrate 101 may be a silicon substrate, such as a semiconductor wafer, wherein the silicon has a crystalline orientation of (111) and a lattice constant of 3.84 or else may be a silicon carbon substrate with a lattice constant of 3.08 Å. In this embodiment the silicon may have a thickness of between about 500 µm and about 1,000 µm, and may have a diameter of 150 mm, 200 mm, 300 mm, or larger. However, any suitable dimensions may be utilized.

FIGS. 1A-1B additionally illustrate a plurality of die regions 103 (represented by dashed boxes in FIG. 1A) which are regions where semiconductors dies 401 (not yet visible because they have not yet been formed at this point in the process) are intended to be manufactured from and/or on the substrate 101. As can be seen, the substrate 101 is utilized to form multiple semiconductor dies 401, and while FIG. 1A illustrates the manufacture of sixteen semiconductor dies 401, this is intended to be illustrative, as any suitable number of semiconductor dies 401 may be manufactured.

Between each of the die regions 103, there is illustrated a scribe region 107 which is utilized in order to separate the individual die regions 103 from each other and to prepare for a singulation process (described further below with respect to FIG. 5B). The scribe region 107 may be formed by not placing functional structures (such as active devices) into the area intended for the scribe region 107. Other structures, such as test pads or dummy metals used for planarization, could be placed into the scribe region 107, but would not be necessary for the functioning of the semiconductor dies 401 once the semiconductor dies 401 have been separated from the semiconductor wafer 100. The scribe region 107 may have a width of between about 20 µm and about 180 µm, such as about 80 µm. However, any suitable dimensions may be utilized.

FIGS. 1A-1B additionally illustrate the placement and/or formation of the fences 105 onto the substrate 101 and into the scribe regions 107 between the die regions 103. In an embodiment the fences 105 are utilized in order to help prevent subsequent epitaxial growth from occurring in at least a portion of the scribe region 107 between die regions 103. Such limitation of subsequent growth processes helps to relieve stresses within the grown materials that can damage subsequently formed devices.

In an embodiment, the fences 105 may be a material such as a photoresist. In one particular embodiment, the photoresist may comprise a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., an acid labile group) or otherwise react when mixed with acids, bases, or free radicals generated by the PACs. In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like Additionally, the photoresist also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

The individual components of the photoresist may be placed into the photoresist solvent in order to aid in the mixing and placement of the photoresist. To aid in the mixing and placement of the photoresist, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Optionally, a photoresist cross-linking agent may also be added to the photoresist. The photoresist cross-linking agent reacts with the photoresist polymer resin within the photoresist after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

In an embodiment the photoresist polymer resin, the PACs, the radical inhibitors, along with any desired additives or other agents, are added to the photoresist solvent for application. Once added, the mixture is then mixed in order to achieve an even composition throughout the photoresist in order to ensure that there are no defects caused by an uneven mixing or non-constant composition of the photoresist. Once mixed together, the photoresist may either be stored prior to its usage or else used immediately.

Once ready, the photoresist may be utilized by initially applying the photoresist. The photoresist may be applied so that the photoresist coats an upper exposed surface of the substrate 101, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist may be applied such that, after development (described further below) it has a first height $H_1$ over the surface of the substrate 101 of between about 1 µm and about 20 µm.

Once the photoresist has been applied to the substrate 101, a pre-bake of the photoresist is performed in order to cure and dry the photoresist prior to exposure to finish the application of the photoresist. The curing and drying of the photoresist removes the photoresist solvent component while leaving behind the photoresist polymer resin, the PACs, the radical inhibitors, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist. The pre-bake is performed for a time sufficient to cure and dry the photoresist, such as between about 10 seconds to about 5 minutes, such as about 90 seconds.

Once the photoresist has been applied and cured, the photoresist may be imaged. In an embodiment the photoresist may be exposed to a patterned energy source (e.g., patterned light), in which energy which impinges upon the photoresist will cause the PACs to generate an acid, base, or free radical. This acid, base or free radical will then go on to react with the polymer resin (and/or any of the desired additives such as the cross-linker) in order to create a chemical and physical difference between those areas of the photoresist which were impacted by the patterned energy source and those areas of the photoresist which were not impacted by the patterned energy source.

After the photoresist has been exposed, a post-exposure baking may be used in order to assist in the generating, dispersing, and reacting of the acid/base/free radical generated from the impingement of the patterned energy upon the PACs during the exposure. Such assistance helps to create or enhance chemical reactions which generate chemical differences between the exposed region and the unexposed region within the photoresist. These chemical differences also caused differences in the solubility between the exposed region and the unexposed region. In an embodiment this post-exposure baking may occur at temperatures of between about 40° C. and about 200° C. for a period of between about 10 seconds and about 10 minutes. However, any suitable temperatures and times may be utilized.

After the photoresist has been exposed and the post-exposure baking has occurred, the photoresist may be developed using either a negative tone developer or a positive tone developer, depending upon the desired pattern for the photoresist. In an embodiment the developer may be applied using a spin-on method, a dip process, a puddle process, a spray-on process, combinations, of these, or the like. However, any suitable materials and processes may be utilized to develop the photoresist.

In an embodiment the fences 105 are placed within the scribe regions 107 of the substrate 101, and extend across the substrate 101. As such, the fences 105 may be formed to have a first width $W_1$ of between about 1 µm and about 150 µm and a first length $L_1$ of between about 1 µm and the size of the substrate 101 (e.g., 8 inches, 12 inches, etc.). However, any suitable dimensions may be utilized.

Additionally, in the illustrated embodiment the fences 105 will surround areas which contain individual ones of the die regions 103. As such, the fences 105 may surround an area with a second width $W_2$ and a second length $L_2$, wherein the second width $W_2$ and the second length $L_2$ are based on the final desired size of the dies to be formed. However, any suitable dimensions may be utilized.

However, while the use of a photoresist to form the fences 105 is one embodiment that may be used, in another embodiment the fences 105 may comprise a material that has a lattice constant that does not match the lattice constant of the films to be grown (described further below with respect to FIG. 2A-2B). In a particular embodiment the fences 105 may comprise a layer of a complex oxide such as silicon oxide ($SiO_2$), titanium oxide ($TiO_2$), combinations of these, or the like, or a dielectric such as silicon nitride ($Si_3N_4$). However, any suitable material may be utilized.

In embodiments in which the fences 105 are formed using the complex oxide, the fences 105 may be formed by initially deposited the complex oxide using a deposition process such as chemical vapor deposition, atomic layer deposition, physical vapor deposition, combinations of these, or the like to the first height $H_1$. However, any suitable material and any suitable process may be utilized.

Once the complex oxide has been deposited, the complex oxide may be patterned into the desired size and shape. For example, in some embodiments the complex oxide may be patterned using a photolithographic masking and etching process, whereby a photoresist (e.g., a tri-layer photoresist) is placed, exposed, and developed, and then used as a mask during a directional etching process, such as a reactive ion etching process. However, any suitable patterning process may be utilized.

Additionally, while the fences 105 have been illustrated and described above as being formed as straight lines or fence shapes, this is intended to be illustrative and is not intended to limit the embodiments. Rather, any suitable shape for the fences, such as circles or triangles, or any combination of shapes, may be utilized, and all such shapes are fully intended to be included within the scope of the embodiments.

Figure 2A:
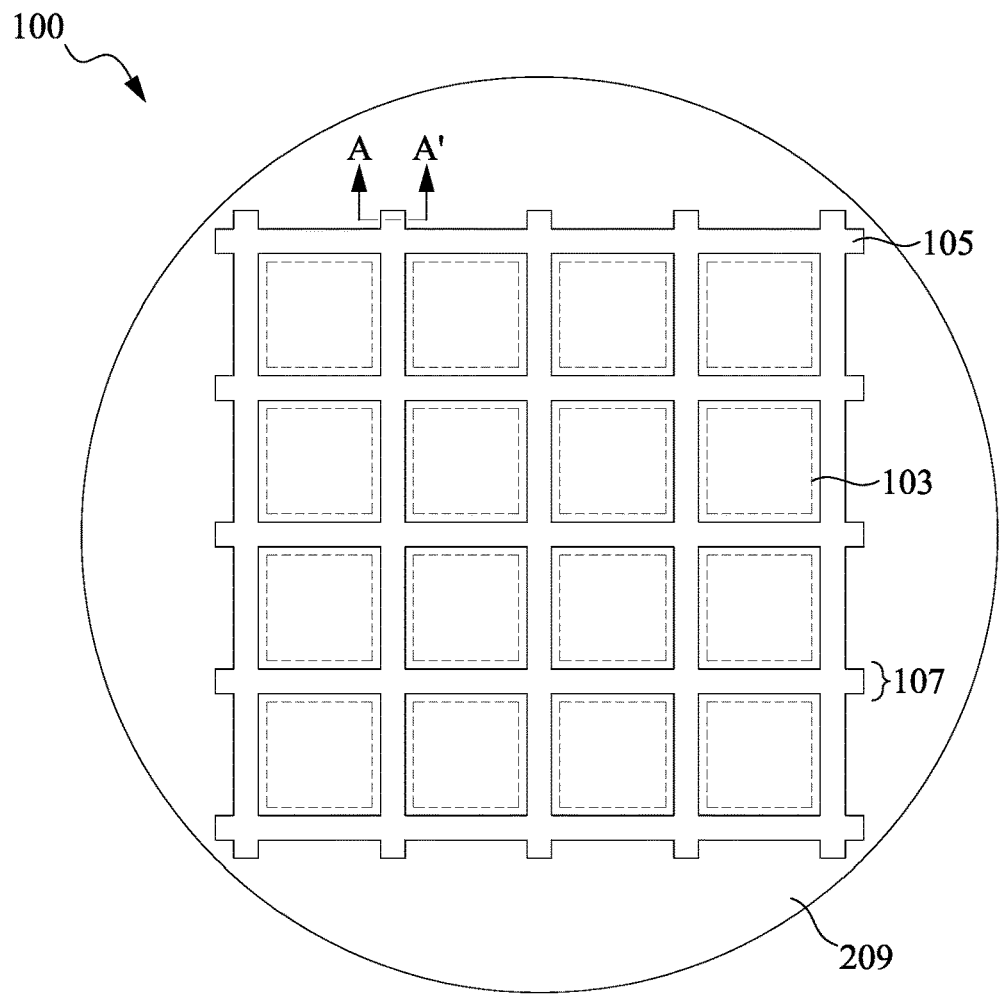
FIGS. 2A-2B illustrate formation of a plurality of layers, in accordance with some embodiments.
Figure 2B:
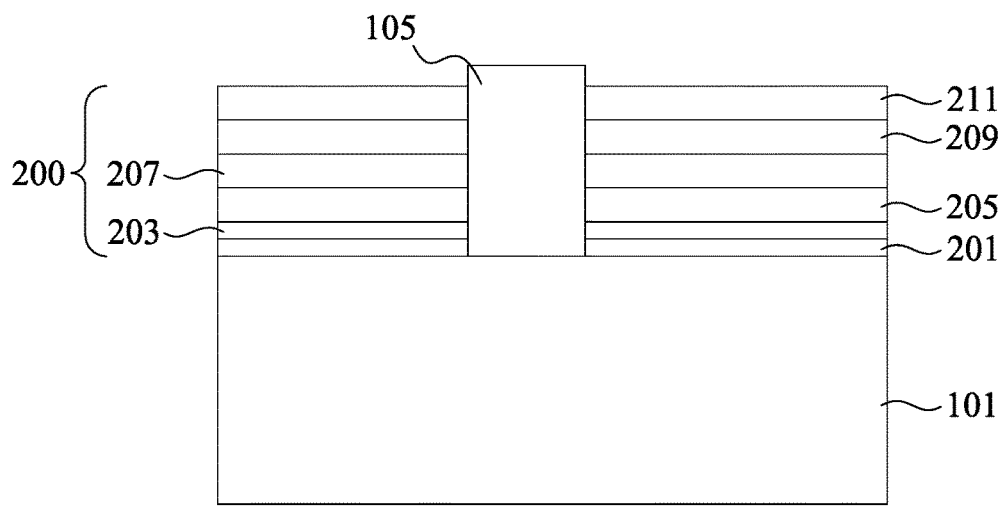

FIGS. 2A-2B illustrate formation of a stack of layers 200 which include a buffer layer 201, a graded layer 203, a first III-V compound layer 205, a second III-V compound layer 207, a third III-V compound layer 209, and an active layer 211. In accordance with some embodiments, the buffer layer 201 is first formed over the substrate 101, which acts as the buffer and/or the transition layer for the subsequently formed overlying layers. The buffer layer 201 may be epitaxially grown using Metal Organic Vapor Phase Epitaxy (MOVPE). The buffer layer 201 may function as an interface to reduce lattice mismatch between the substrate 101 and the subsequently formed first III-V compound layer 205. In some embodiments, the buffer layer 201 includes an aluminum nitride (AlN) layer (with, e.g., a lattice constant of 3.11 Å) having a thickness in a range between about 10 nanometers (nm) and about 300 nm.

The buffer layer 201 may include a single layer or a plurality of layers. For example, the buffer layer 201 may include low-temperature AlN layer formed at a temperature between about 800° C. and about 1,200° C., and high-temperature AlN layer formed at a temperature between about 1,000° C. and about 1,400° C. In some embodiments, the low-temperature AlN layer has a thickness in a range between about 10 nanometers (nm) and about 100 nm, and the high-temperature AlN layer has a thickness in a range between about 100 nanometers (nm) and about 200 nm.

The graded layer 203 is formed over the buffer layer 201. In an embodiment the graded layer 203 may also act as a buffer layer and can be epitaxially grown using MOVPE, for example. The graded layer 203 may include an aluminum gallium nitride (AlGaN) layer, which may have a thickness in a range from about 500 nm to about 1,000 nm. The graded layer 203 may be a graded buffer layer, which means that the relative amounts of the respective aluminum and/or gallium content change with depth in the layer throughout a part or the total thickness of graded layer 203. The relative amounts may change gradually to reduce the lattice parameter with the distance from the substrate 101.

For example, in one embodiment the graded layer 203 may comprise three or more sub layers, with the percentages of aluminum and/or gallium in each of the sub layers being different from each other. In some exemplary embodiments, a first sub layer has an aluminum percentage between about 65 percent and about 85 percent, a second sub layer has an aluminum percentage between about 35 percent and about 60 percent, and a third sub layer has an aluminum percentage between about 10 percent and about 30 percent. However, any suitable number of sub-layers, and percentages within the sub-layers, may be utilized.

The first III-V compound layer 205 is grown over the graded layer 203. In some embodiments, the first III-V compound layer 205 is a gallium nitride (GaN) layer (with, e.g., a lattice constant of 3.19 Å) which is epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some exemplary embodiments, the III-V compound layer 205 has a thickness ranging from about 0.5 micron to about 10 microns, and may be undoped. In other embodiments, the first III-V compound layer 205 is unintentionally doped, such as lightly doped with n-type dopants due to a precursor used for forming the first III-V compound layer 205, with no dopant that may cause the first III-V compound layer 205 to be n-type or p-type intentionally added.

A second III-V compound layer 207 is grown on, and may contact, the first III-V compound layer 205. In an embodiment the second III-V compound layer 207 has a band gap higher than the band gap of the first III-V compound layer 205 such that an interface is formed between the first III-V compound layer 205 and the second III-V compound layer 207. In some embodiments, the second III-V compound layer 207 is an AlGaN layer, and may be epitaxially grown over the first III-V compound layer 205 through MOVPE, for example. When formed of AlGaN, the second III-V compound layer 207 may be grown using an aluminum-containing precursor, a gallium-containing precursor, and a nitrogen-containing precursor. The aluminum-containing precursor may include trimethylaluminum (TMA), triethyl-aluminium (TEA), or other suitable chemicals. The gallium-containing precursor and the nitrogen-containing precursor may be selected from the same candidate precursors used for forming the first III-V compound layer 205. In some exemplary embodiments, the second III-V compound layer 207 may have thickness ranging from about 2 nm to about 50 nm.

Once the second III-V compound layer 207 has been formed, the third III-V compound layer 209 may be grown over the second III-V compound layer 207. In an embodiment the third III-V compound layer 209 may be a III-V compound such as gallium nitride which is grown through MOVPE, for example. However, any suitable material and any suitable process may be utilized.

Additionally, the third III-V compound layer 209 may be doped. In some embodiments the third III-V compound layer 209 may be doped with p-type dopants, n-type dopants, or different regions may be doped with different dopants. Any suitable dopants or combination of dopants may be utilized.

Once the third III-V compound layer 209 has been formed, the active layer 211 may be grown over the third III-V compound layer 209. In an embodiment the active layer 211 is utilized as an active layer to form active devices and passive devices as part of an integrated circuit. In an embodiment the active layer 211 may be a III-V compound such as gallium nitride which is grown through MOVPE, for example. However, any suitable material and any suitable process may be utilized.

Additionally, as part of a layer that will be used to form active devices, the active layer 211 may be doped. In some embodiments the active layer 211 may be doped with p-type dopants, n-type dopants, or different regions may be doped with different dopants. Any suitable dopants or combination of dopants may be utilized.

However, by utilizing the fences 105 to prevent growth between certain areas, the individual regions of growth upon which the die regions 103 are grown have a smaller area. This growth of multiple smaller areas helps to alleviate stresses that occur when larger areas (e.g., areas over the entire substrate 101) are grown as a single, continuous sheet. By reducing the stresses, these stresses are not present to damage subsequently manufactured devices.

Additionally, in some embodiments the height of the combined stack of layers 200 may be smaller than the first height $H_1$ of the fences 105, as illustrated in FIG. 2B. However, this is intended to be illustrative and is not intended to be limiting. In particular, in other embodiments the height of the combined stack of layers 200 may be larger than the first height $H_1$ of the fences 105.

Figure 3A:
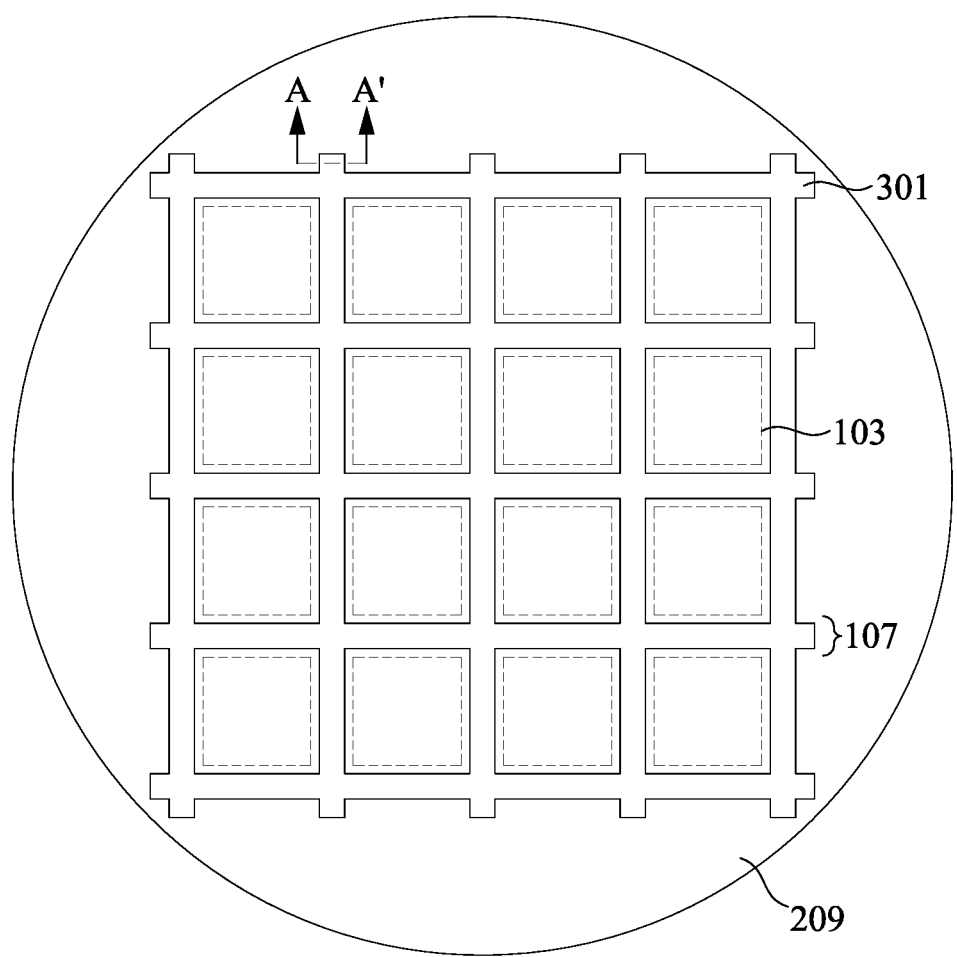
FIGS. 3A-3B illustrate a removal of the fences, in accordance with some embodiments.
Figure 3B:
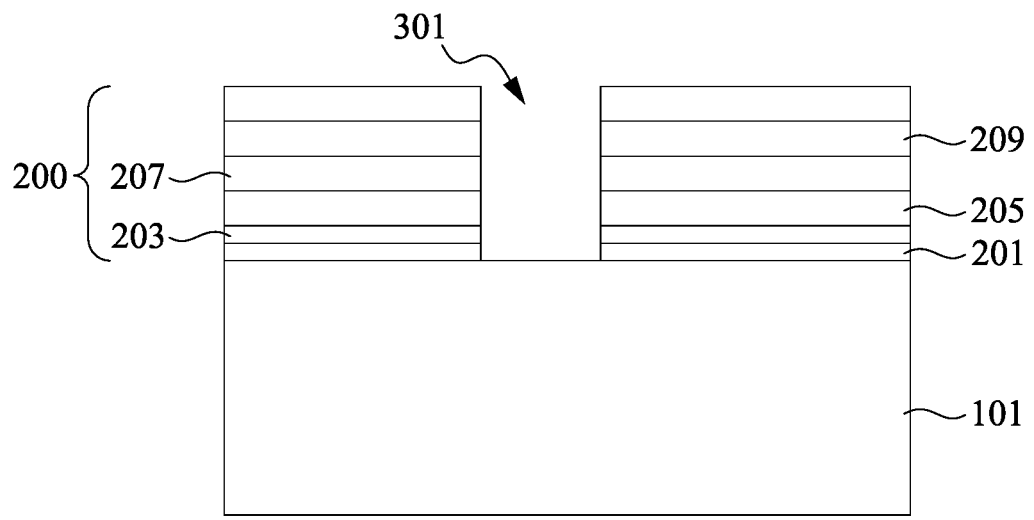

FIGS. 3A-3B illustrate a removal of the fences 105 in order to form first openings 301 within the stack of layers 200. In an embodiment in which the fences 105 are formed utilizing photoresist materials, the fences 105 may be removed using an ashing process, whereby the temperature of the photoresist is increased until the photoresist undergoes a thermal decomposition and may be easily removed.

In other embodiments in which materials such as the complex oxide are utilized, the fences 105 may be removed using an etching process, such as a wet etching process. In such an embodiment masks may optionally be utilized to protect the top surfaces of the third III-V compound layer 209, and a liquid etchant that selectively removes the material of the fences 105 may be utilized until the material of the fences 105 has been removed. The etching process can either be stopped on the surface of the substrate 101 or, in other embodiments, the etching process may be continued and overetch into the substrate 101. However, any suitable method and etchants may be utilized.

Figure 4A:
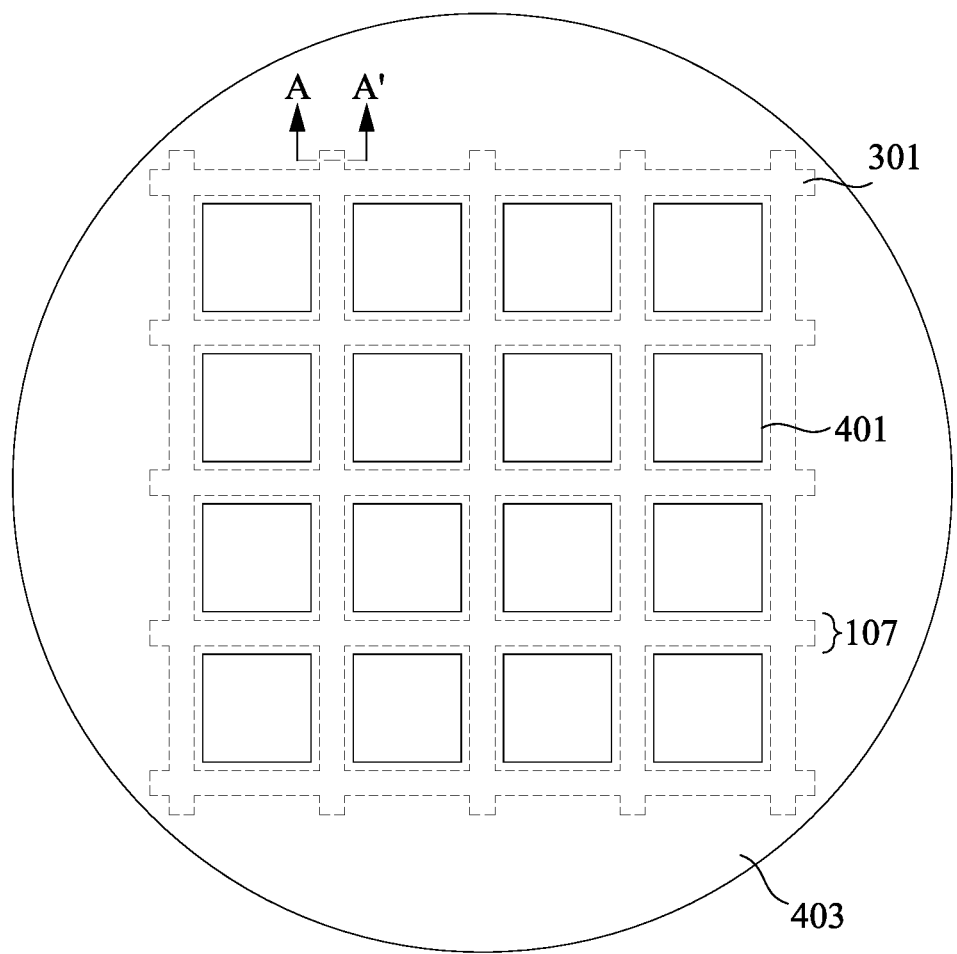
FIGS. 4A-4B illustrate formation of a stack of layers, in accordance with some embodiments.
Figure 4B:
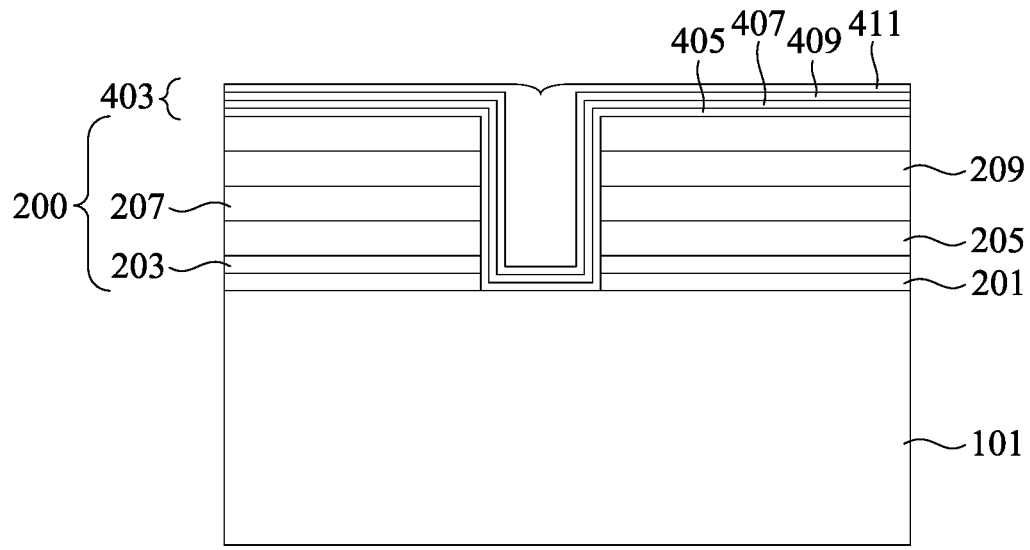

FIGS. 4A-4B illustrate the deposition of a plurality of layers 403 in order to form the semiconductor dies 401 using the third III-V compound layer 209. In an embodiment the plurality of layers 403 comprise one or more of the layers which are utilized in order to make active devices from the third III-V compound layer 209 and other passive devices, to form conductive connections through dielectric layers to the active devices, to form conductive routing between the active devices to form a functional circuit, to passivate the top surfaces of the conductive routing layers, and to provide electrical connections through the passivation layer. However, any suitable number and type of layers may be utilized.

For example, at each step of the manufacturing process for the semiconductor dies 401, materials may be deposited, and then portions of the deposited material may be removed in order to achieve the desired shape and function of the different structures. For example, for an active device such as a transistor, dummy gates are formed by depositing material and then etching away undesired portions of that material, source/drain regions are formed, an interlayer dielectric layer is deposited around the dummy gate and over the source/drain regions, the dummy gates are removed, and a gate dielectric and gate electrodes are formed.

Similarly, after the active devices have been manufactured, redistribution layers may be formed to provide connection to and interconnection between the various active devices. In some embodiments one or more dielectric layers are deposited, and then a damascene or dual damascene process is utilized to form openings through the dielectric layers, and then fill the openings with conductive materials. Once formed, a passivation layer is placed to protect the structure.

However, as each of these materials are deposited, the material is not deposited solely within the die regions 103, and will also be deposited within the first openings 301. As such, for each deposited material, the deposited material may either be left as a layer within the first openings 301, or else may be removed during a subsequent etching process, allowing any desired number of layers of material to remain in the first openings 301.

For example, and looking particularly at the embodiment illustrated in FIG. 4B, after formation of the semiconductor dies 401 has been completed, the first openings 301 may be filled with four layers of material that were deposited at different points within the manufacturing of the semiconductor dies 401. For example, the first openings 301 may be filled with a first layer 405, a second layer 407, a third layer 409, and a fourth layer 411. In an embodiment the first layer 405 may be a first dielectric material (e.g., PBO) that was deposited in order to surround a dummy gate electrode. Similarly, the second layer 407 may be a conductive material that was used to form a gate electrode, the third layer 409 may be a dielectric material for an interlayer dielectric layer, and the fourth layer 411 may be a passivation layer. All other deposited layers have been patterned in order to remove that portion of the deposited material from the first openings 301.

By depositing materials for the plurality of layers 403 into the first openings 301, there is present at the bottom of the first openings 301 (and, e.g., in physical contact with the substrate 101) materials which were not specifically grown from the substrate 101. As such, these materials do not share the same lattice constants as the substrate 101.

Figure 5A:
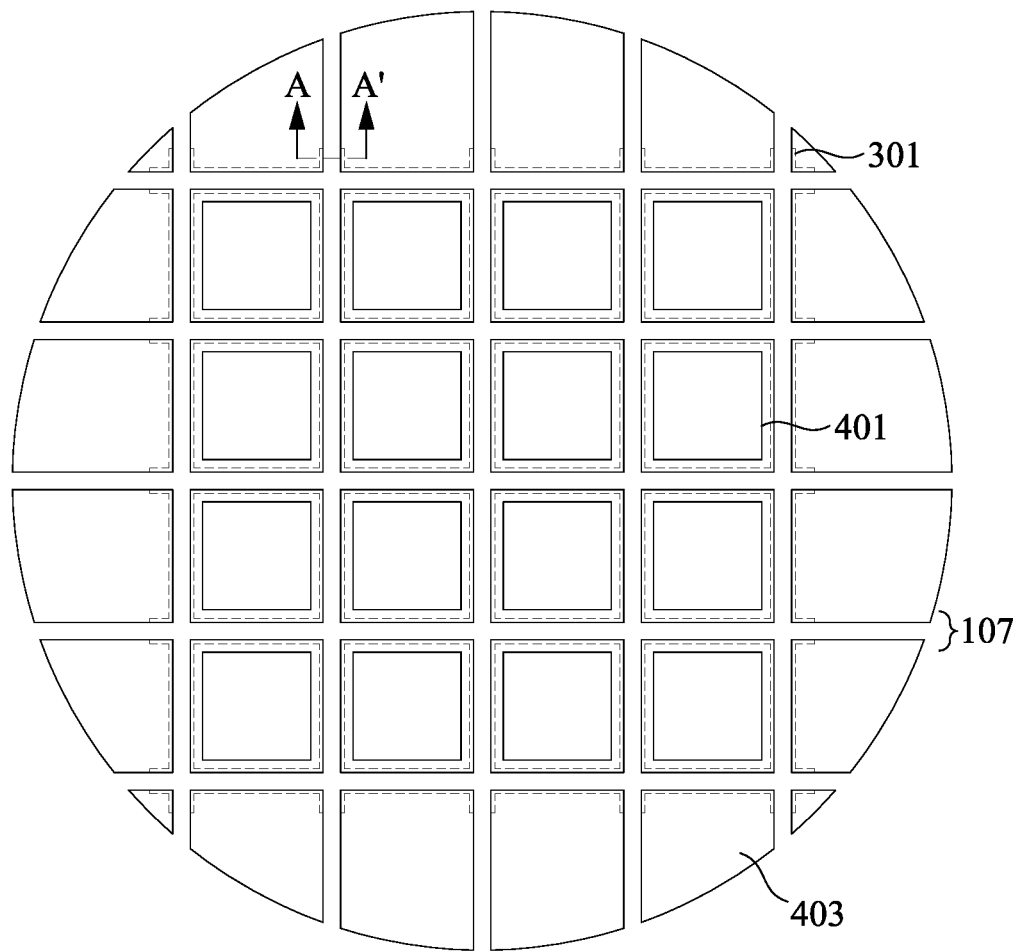
FIGS. 5A-5B illustrate a singulation process, in accordance with some embodiments.
Figure 5B:
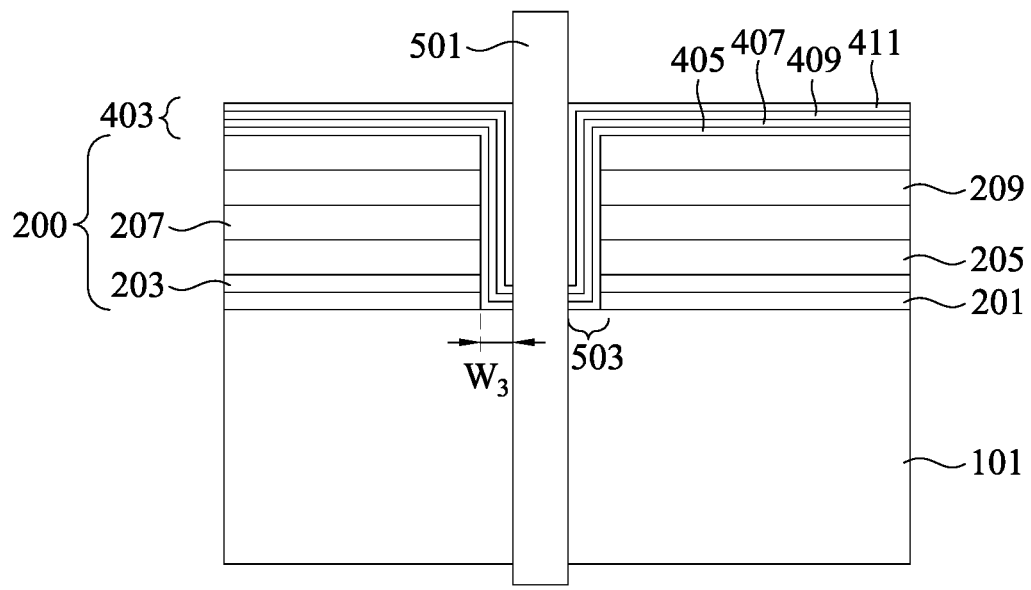

FIGS. 5A-5B illustrate that, once the semiconductor dies 401 have been formed and the first openings 301 have been filled, the semiconductor wafer 100 may be singulated in order to separate the individual semiconductor dies 401. In an embodiment the singulation may be performed by using a saw blade (represented in FIG. 5B by the box labeled 501) to slice through the plurality of layers 403 within the first openings 301 of the scribe region 107, thereby separating one individual semiconductor die 401 from another individual semiconductor die 401. However, as one of ordinary skill in the art will recognize, utilizing the saw blade 501 to singulate the semiconductor wafer 100 is merely one illustrative embodiment and is not intended to be limiting. Other methods for singulating, such as utilizing one or more etches to singulate the semiconductor wafer 100, may also be utilized. These methods and any other suitable methods may be utilized to singulate the semiconductor wafer 100.

During the singulation process, the plurality of layers 403, in stead of simply filling the first openings 301 which are sawed through, becomes a sidewall spacer 503 which covers the sidewalls of the stack of layers 200 and fills an area between a sidewall of the stack of layers 200 and a surface of the substrate 101. Additionally, the sidewall spacer 503 is also aligned with a sidewall of the substrate 101. In some embodiments the sidewall spacer 503 may have a third width $W_3$ of less than about 100 μm. However, any suitable dimensions may be utilized.

Additionally, in some embodiments the various layers of the plurality of layers 403 (e.g., the first layer 405, the second layer 407, the third layer 409, and the fourth layer 411) may either be formed or shaped to have a decreasing thickness as the sidewall spacer 503 extends away from the stack of layers 200. For example, the second layer 407 may have a smaller thickness than the first layer 405, the third layer 409 may have a smaller thickness than the second layer 407, and the fourth layer 411 may have a smaller thickness than the third layer 409. These thicknesses may be achieved either during the manufacturing process of each layer (e.g., depositing the layers at different thicknesses or etching the layers within the first opening 301 after deposition) or else may be made by thinning the outer layer (e.g., the fourth layer 411) with the saw blade 501 during the singulation process. Any suitable method or combination of methods may be utilized.

Figure 6A:
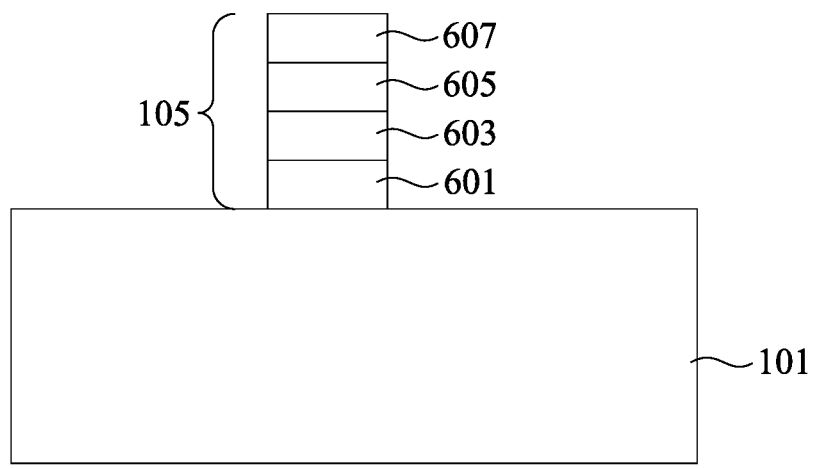
FIGS. 6A-6B illustrate multilayer fences, in accordance with some embodiments.

FIG. 6A illustrates another embodiment in which the fences 105, instead of comprising a single layer of material as described above with respect to FIGS. 1A-1B, are instead formed of multiple layers, such as a first fence layer 601, a second fence layer 603, a third fence layer 605, and a fourth fence layer 607. However, while an embodiment with four layers is illustrated and described with respect to FIG. 6A, this is intended to be illustrative and is not intended to be limiting, as any suitable number of layers, such as 2 layers, 3 layers, or more than four layers, may be utilized.

In an embodiment the first fence layer 601 may comprise one or more of any of the materials described above for the single layer fences 105. For example, the first fence layer 601 may comprise a photoresist material deposited using a spin-on process or may be a complex oxide deposited using a deposition process. However, any suitable material and any suitable processes may be utilized.

The second fence layer 603 may be a different material than the first fence layer 601, but may still be similar to the first fence layer 601, such as by being a material such as a photoresist or complex oxide. The second fence layer 603 may be deposited onto the first fence layer 601 using one of the placement methods (e.g., spin-on process or deposition process), and may be placed prior to any patterning or removal of the material of the first fence layer 601. However, any suitable material and any suitable processes may be utilized.

The third fence layer 605 may be a different material than the second fence layer 603, but may still be similar to the first fence layer 601, such as by being a material such as a photoresist or complex oxide. The third fence layer 605 may be deposited onto the second fence layer 603 using one of the placement methods (e.g., spin-on process or deposition process), and may be placed prior to any patterning or removal of the material of the second fence layer 603 or the first fence layer 601. However, any suitable material and any suitable processes may be utilized.

The fourth fence layer 607 may be a different material than the third fence layer 605, but may still be similar to the first fence layer 601, such as by being a material such as a photoresist or complex oxide. The fourth fence layer 607 may be deposited onto the third fence layer 605 using one of the placement methods (e.g., spin-on process or deposition process), and may be placed prior to any patterning or removal of the material of the third fence layer 605, the second fence layer 603, and the first fence layer 601. However, any suitable material and any suitable processes may be utilized.

Once each of the first fence layer 601, the second fence layer 603, the third fence layer 605, and the fourth fence layer 607 have been deposited, each of the layers are then patterned in order to form a stack of layers in the desired shape of the fences 105. In a particular embodiment, the stack of layers are patterned using a photolithographic masking and etching process, whereby a photoresist is applied, exposed, and developed, and then unprotected portions of the first fence layer 601, the second fence layer 603, the third fence layer 605, and the fourth fence layer 607 are removed using one or more etching processes or other removal processes. However, any suitable method of patterning the first fence layer 601, the second fence layer 603, the third fence layer 605, and the fourth fence layer 607 may be utilized.

By depositing each of the first fence layer 601, the second fence layer 603, the third fence layer 605, and the fourth fence layer 607 and then patterning all of them, the fences 105 will have sidewalls which comprise multiple materials. As illustrated in FIG. 6A, the sidewall of the fences 105 in this embodiment comprise the material of the first fence layer 601, material of the second fence layer 603, material of the third fence layer 605, and material of the fourth fence layer 607.

By forming the fences 105 using a multi-layer structures, all of the benefits that can be obtained using a multi-layered structure may be obtained. For example, using specific materials with desired etching characteristics may allow for more control of the overall shape that can be obtained, such as by being able to obtain more vertical sidewalls for the fences 105.

Figure 6B:
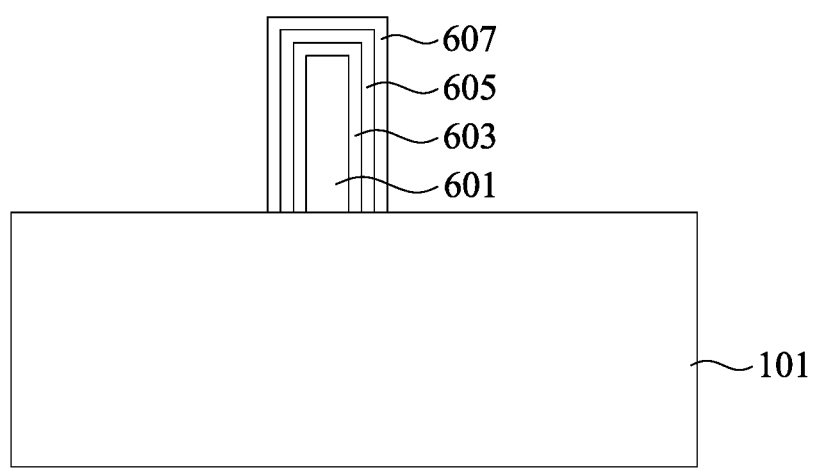

FIG. 6B illustrates another multi-layer embodiment of the fences 105 which utilizes the first fence layer 601, the second fence layer 603, the third fence layer 605, and the fourth fence layer 607. In this embodiment, however, instead of depositing each of the layers prior to any patterning, each of the layers is deposited and then patterned prior to deposition of an overlying layer. For example, the first fence layer 601 is deposited as described above, and then patterned prior to deposition of the second fence layer 603. The second fence layer 603 is then deposited and patterned prior to deposition of the third fence layer 605, the third fence layer 605 is deposited and patterned prior to deposition of the fourth fence layer 607, and then the fourth fence layer 607 is deposited and patterned.

By depositing and patterning each of the first fence layer 601, the second fence layer 603, the third fence layer 605, and the fourth fence layer 607 prior to deposition of an overlying layer, the fences 105 will maintain a multi-layer structure. This multi-layer structure, however, will have a single material along its sidewalls. For example, in the embodiment illustrated in FIG. 6B, the fence 105 will have sidewalls which comprise only the material of the fourth fence layer 607.

However, while fences 105 with a multi-layer structure that has four layers is discussed and illustrated above with respect to FIGS. 6A-6B, this precise number of layers is intended to be illustrative and is not intended to be limiting. Rather, any suitable number of layers, such as two layers, three layers, the illustrated four layers, or five or more layers, may be utilized as desired. Any suitable number of layers may be utilized.

Additionally, once the fences 105 have been formed, the process may be continued as described above with respect to FIGS. 2A-5B. In particular, the stack of layers 200 may be grown, the fences 105 may be removed to form the first openings 301, the additional layers are deposited to fill in the first openings 301, and the device may be singulated through the first openings 301. However, by growing the stack of layers 200 as described, there is a reduced amount of stress within the stack of layers 200, and therefore less damage will occur during the chip manufacturing process and during the singulation process.

Figure 7:
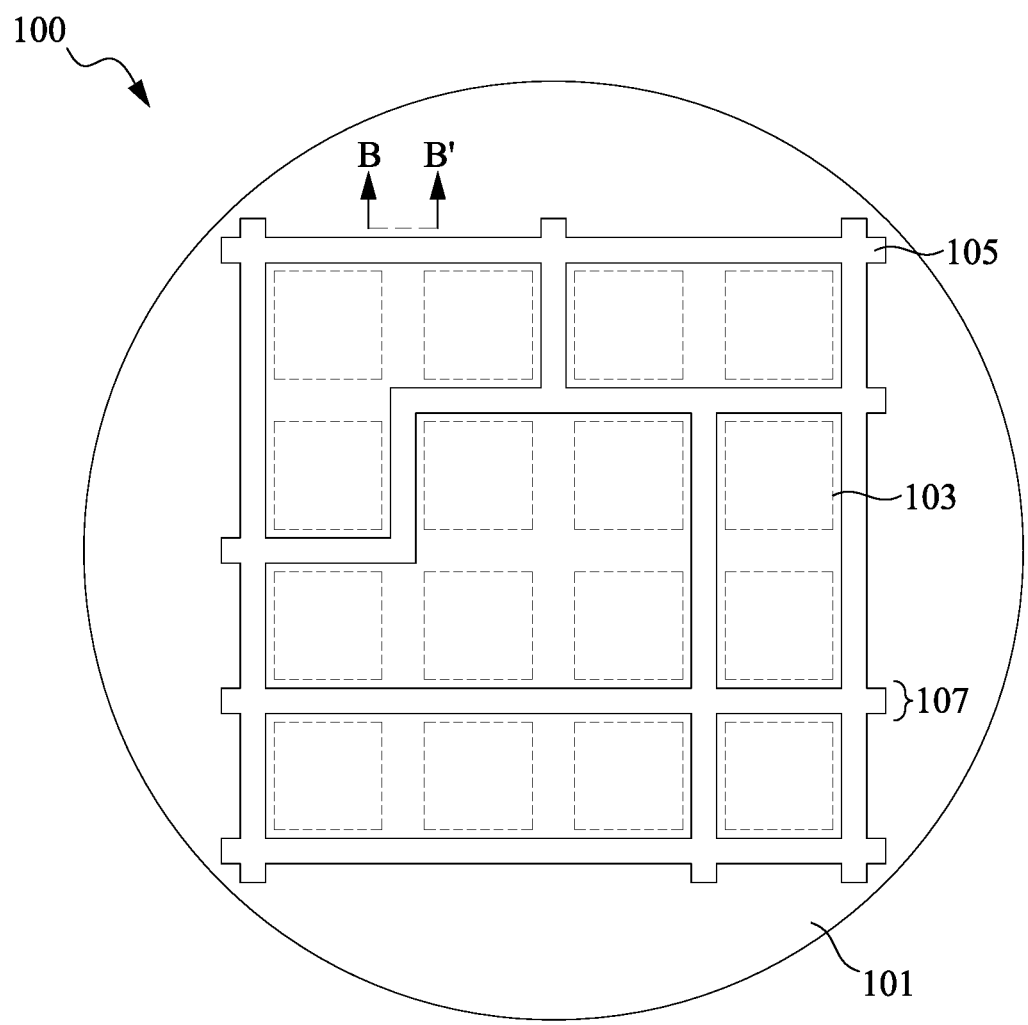
FIG. 7 illustrates the fences surrounding multiple dies, in accordance with some embodiments.

FIG. 7 illustrates another embodiment in which the fences 105 are manufactured within the scribe regions 107 between the die regions 103. In this embodiment, however, instead of the fences 105 being formed between each and every one of the die regions 103, the fences 105 are formed between only some of the die regions 103. As such, some scribe regions 107 have the fences 105 formed within the scribe regions 107 while other scribe regions 107 do not have the fences 105 formed within the scribe regions 107.

Additionally in the embodiments illustrated in FIG. 7, the fences 105 can be formed to create regions that comprise multiple die regions 103. For example, in some embodiments the fences 105 may be formed to surround two of the die regions 103, three of the die regions 103, four of the die regions 103, or five of the die regions 103. However, any suitable number of die regions 103 may be located within a single region surrounded by the fences 105.

Figure 8A:
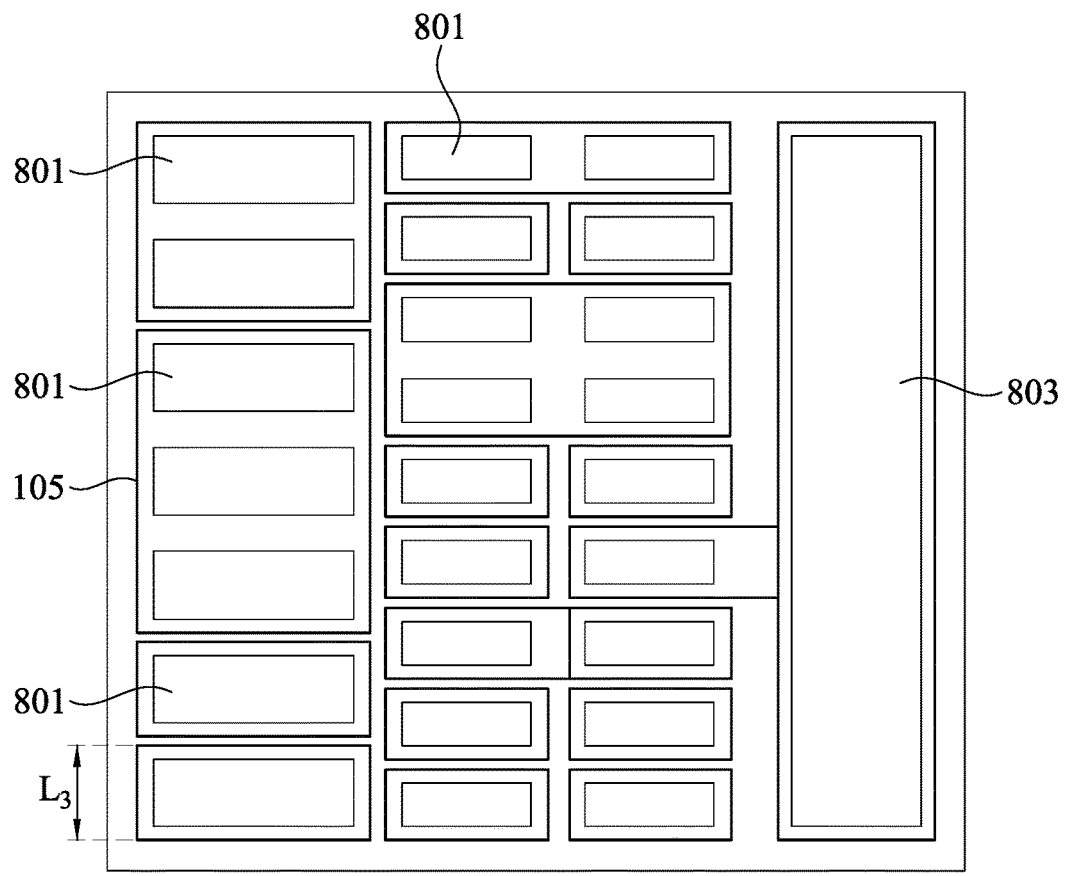
FIGS. 8A-8B illustrate formation of fences within semiconductor dies, in accordance with some embodiments.

FIG. 8A illustrates that, while the fences 105 may be formed within the scribe regions 107 around the die regions 103, the fences 105 may also be formed within each of the die regions 103 to surround and protect smaller regions. For example, in some embodiments, the die regions 103 may comprise a first sub-region 801 and a second sub-region 803. In an embodiment the first sub-region 801 may be region such as a high voltage region, while the second sub-region 803 may be a region such as a non-high voltage region. However, any suitable type of sub-regions may be utilized.

In such an embodiment the fences 105 may be manufactured around one or more of the first sub-regions 801 and may be manufactured around one or more of the second sub-regions 803, and may have a third length $L_3$ that is less than the length of the die regions 103. Any suitable or desired combination of regions may be surrounded by the fences 105.

Figure 8B:
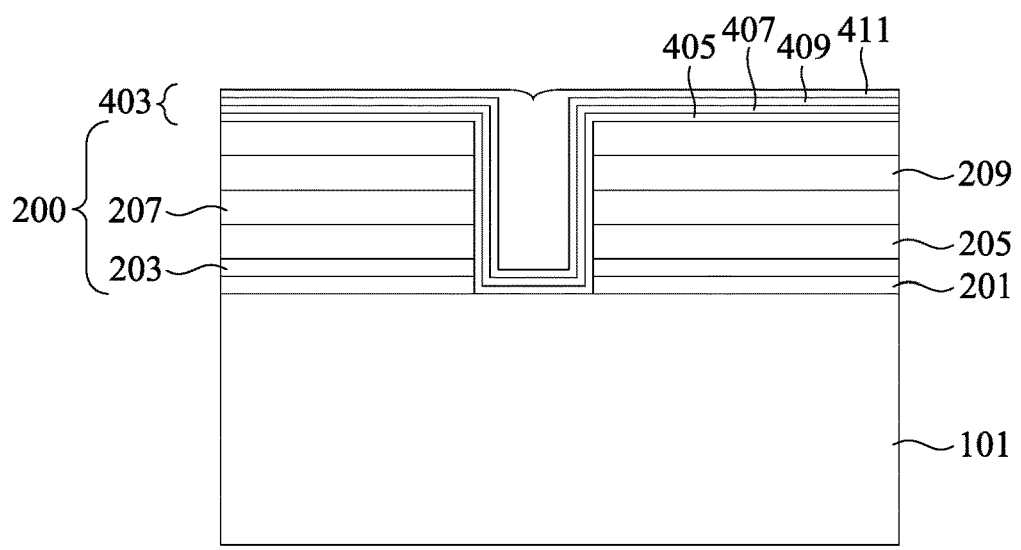

FIG. 8B illustrates that, once the fences 105 are formed around the desired regions, the process may be continued as described above with respect to FIGS. 2A-4B. In particular, the stack of layers 200 may be grown, the fences 105 may be removed to form the first openings 301, and the plurality of layers 403 are deposited to fill in the first openings 301. However, by growing the stack of layers 200 as described, there is a reduced amount of stress within the stack of layers 200, and therefore less damage will occur during the chip manufacturing process and during the singulation process.

However, because the fences 105 in this embodiment are formed within each of the die regions 103, and may or may not be formed within the scribe regions 107, there is no singulation which occurs within the die regions 103. As such, the plurality of layers 403 remains in place within the die regions 103 in order to help protect and separate the different regions that are formed within the die regions 103 (e.g., the first sub-regions 801 and the second sub-regions 803.

By utilizing the processes described herein, stresses that are formed during growth of III-V layers can be reduced or eliminated. In particular, by using the fences 105 to separate a large growth area into a plurality of smaller growth areas, the separated, individual areas will experience less stress during the growing process. As such, this stress is not present during later processes, such as singulation processes, where the stresses can create undesired damage such as ball defects or cracks along the wafer edge. As such, damage caused by stress can be alleviated without the use of more expensive processes, such as superlattice processes. Further, larger wafers may be utilized, and less damage occurs, thereby increasing the overall yield of the manufacturing process.

In accordance with an embodiment, a method of manufacturing a semiconductor device, the method including: depositing a fence between a first region of a semiconductor substrate and a second region of the semiconductor substrate; growing a III-V material layer on the semiconductor substrate after the depositing the fence; removing the fence after the growing the III-V material layer to form a first opening; and depositing material over the semiconductor substrate, wherein the depositing the material at least partially fills the first opening. In an embodiment, the method further includes singulating the first region from the second region through the material. In an embodiment, the first region and the second region are part of a single semiconductor die region. In an embodiment, the III-V material is gallium nitride. In an embodiment, the fence comprises a photoresist. In an embodiment, the fence has a lattice constant that is different from the semiconductor substrate. In an embodiment, the fence comprises two or more layers of different fence materials.

In accordance with another embodiment, a method of manufacturing a semiconductor device, the method includes: forming a fence between a first die region and a second die region of a semiconductor substrate; using the fence as a mask, growing a stack of III-V material layers onto the first die region and the second die region, wherein after the growing the stack of III-V material layers a portion of the III-V material layers has a first sidewall adjacent to the fence; removing the fence from a first region to expose sidewalls of the stack of III-V material layers; depositing one or more materials into the first region; and singulating the first die region from the second die region, wherein after the singulating a portion of the one or more materials remains adjacent to the sidewalls of the stack of III-V material layers. In an embodiment, the forming the fence comprises forming multiple layers of different fence materials. In an embodiment, the forming the fence deposits each one of the different fence materials before patterning any of the different fence materials. In an embodiment, the forming the fence deposits and patterns each layer separately. In an embodiment, the forming the fence comprising forming a photoresist in physical contact with the semiconductor substrate. In an embodiment, the methods further include: forming a second fence between a first inter-die region and a second inter-die region; and removing the second fence from a second region. In an embodiment, the singulating the first die region from the second die region removes no material from the second region.

In accordance with yet another embodiment, a semiconductor device includes: a semiconductor substrate with a first sidewall; a plurality of III-V layers over the semiconductor substrate, the plurality of III-V layers comprising a second sidewall mis-aligned with the first sidewall, a surface of the semiconductor substrate extending between the first sidewall and the second sidewall; and a sidewall spacer in physical contact with the second sidewall and the surface of the semiconductor substrate, the sidewall spacer being aligned with the first sidewall. In an embodiment, the sidewall spacer comprises multiple layers of different materials. In an embodiment, each layer of the multiple layers of different materials has a different thickness. In an embodiment, a first layer of the multiple layers of different materials is aligned with the first sidewall and has a smaller thickness than any other layer within the multiple layers of different materials. In an embodiment, the plurality of III-V layers comprise a third sidewall and a fourth sidewall, the third sidewall facing the fourth sidewall, wherein the multiple layers of different materials extends from the second sidewall to make physical contact with both the third sidewall and the fourth sidewall. In an embodiment, the plurality of III-V layers comprises gallium nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a fence between a first region of a semiconductor substrate and a second region of the semiconductor substrate;
   growing a III-V material layer on the semiconductor substrate after the depositing the fence;
   masking the III-V material layer with a mask; while the mask is present, removing the fence after the growing the III-V material layer to form a first opening; and
   depositing material over the semiconductor substrate, wherein the depositing the material at least partially fills the first opening.

2. The method of claim 1, further comprising singulating the first region from the second region through the material.

3. The method of claim 1, wherein the first region and the second region are part of a single semiconductor die region.

4. The method of claim 1, wherein the III-V material layer is gallium nitride.

5. The method of claim 1, wherein the fence comprises a photoresist.

6. The method of claim 1, wherein the fence has a lattice constant that is different from the semiconductor substrate.

7. The method of claim 1, wherein the fence comprises two or more layers of different fence materials.

8. A method of manufacturing a semiconductor device, the method comprising:
   forming a fence between a first die region and a second die region of a semiconductor substrate;
   using the fence as a mask, growing a stack of III-V material layers onto the first die region and the second die region, wherein after the growing the stack of III-V material layers a portion of the III-V material layers has a first sidewall adjacent to the fence, wherein the growing ends prior to the stack of III-V material layers growing over the fence;
   removing the fence from a first region to expose sidewalls of the stack of III-V material layers;
   depositing one or more materials into the first region; and
   singulating the first die region from the second die region, wherein after the singulating a portion of the one or more materials remains adjacent to the sidewalls of the stack of III-V material layers.

9. The method of claim 8, wherein the forming the fence comprises forming multiple layers of different fence materials.

10. The method of claim 9, wherein the forming the fence deposits each one of the different fence materials before patterning any of the different fence materials.

11. The method of claim 9, wherein the forming the fence deposits and patterns each layer separately.

12. The method of claim 8, wherein the forming the fence comprising forming a photoresist in physical contact with the semiconductor substrate.

13. The method of claim 8, further comprising:
   forming a second fence between a first inter-die region and a second inter-die region; and
   removing the second fence from a second region.

14. The method of claim 13, wherein the singulating the first die region from the second die region removes no material from the second region.

15. A method of manufacturing a semiconductor device, the method comprising:
   forming a plurality of III-V layers over a semiconductor substrate;
   removing a fence to expose a first sidewall along the plurality of III-V layers;
   forming a sidewall spacer in physical contact with the first sidewall and the semiconductor substrate; and
   forming a second sidewall along the semiconductor substrate, the second sidewall being mis-aligned with the first sidewall, a surface of the semiconductor substrate extending between the first sidewall and the second sidewall, wherein after the forming the second sidewall the sidewall spacer is aligned with the second sidewall.

16. The method of claim 15, wherein the sidewall spacer comprises multiple layers of different materials.

17. The method of claim 16, wherein each layer of the multiple layers of different materials has a different thickness.

18. The method of claim 17, wherein a first layer of the multiple layers of different materials is aligned with the second sidewall and has a smaller thickness than any other layer within the multiple layers of different materials.

19. The method of claim 16, wherein the plurality of III-V layers comprises a third sidewall and a fourth sidewall, the third sidewall facing the fourth sidewall, wherein the multiple layers of different materials extend from the first sidewall to make physical contact with both the third sidewall and the fourth sidewall.

20. The method of claim 15, wherein the plurality of III-V layers comprises gallium nitride.

* * * * *